(12) United States Patent
Hoffmann et al.

(10) Patent No.: US 7,474,131 B1
(45) Date of Patent: Jan. 6, 2009

(54) DRIVE CIRCUIT

(75) Inventors: Marie-Claire Hoffmann, Munich (DE);
Christian Paulus, Weilheim (DE); Ralf Klein, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/181,902

(22) PCT Filed: Jan. 22, 2000

(86) PCT No.: PCT/DE01/00252

§ 371 (c)(1),
(2), (4) Date: Jul. 24, 2007

(87) PCT Pub. No.: WO01/54278

PCT Pub. Date: Jul. 26, 2001

(30) Foreign Application Priority Data

Jan. 21, 2000 (DE) .................................. 100 02 599

(51) Int. Cl.
*H03K 3/00* (2006.01)

(52) U.S. Cl. ..................................... 327/108; 327/112

(58) Field of Classification Search .................. 327/108, 327/112
See application file for complete search history.

(56) References Cited

U.S. PATENT DOCUMENTS

| 4,800,298 | A | | 1/1989 | Yu et al. | |
|---|---|---|---|---|---|
| 4,827,159 | A | | 5/1989 | Naganuma | |
| 4,924,120 | A | | 5/1990 | Schenk | |
| 5,118,971 | A | | 6/1992 | Schenk | |
| 5,214,320 | A | | 5/1993 | Truong | |
| 5,248,907 | A | * | 9/1993 | Lin et al. | 326/33 |
| 5,428,303 | A | * | 6/1995 | Pasqualini | 326/27 |
| 5,654,663 | A | * | 8/1997 | McClure et al. | 327/530 |
| 5,914,617 | A | * | 6/1999 | Bartlett | 326/81 |
| 6,407,594 | B1 | * | 6/2002 | Milazzo et al. | 327/112 |
| 6,900,672 | B2 | * | 5/2005 | Callahan, Jr. | 327/108 |

FOREIGN PATENT DOCUMENTS

| DE | 195 27 736 C1 | 11/1996 |
|---|---|---|
| EP | 0 455 572 A2 | 11/1991 |
| EP | 0 535 873 B1 | 4/1993 |
| EP | 0575 676 A1 | 12/1993 |
| EP | 0 765 037 A2 | 3/1997 |

* cited by examiner

*Primary Examiner*—Kenneth B. Wells
(74) *Attorney, Agent, or Firm*—Altera Law Group, LLC

(57) ABSTRACT

A driver circuit which has one or more driver transistors connected to a load and which further includes at least one circuit block configured to control the voltage on the gate nodes of the one or more driver transistors and which is connected to the latter. The gate source voltage of the one or more driver transistors can be controlled, using an appropriate configuration of the circuit blocks in relation to the circuit, by the application of the current in such a way that the charging/discharging current is approximately $\sin^2$. The circuit block has a current source that controls the gate voltage on the gate nodes of the one or more driver transistors and the circuit block as an additional first voltage source that provides the operating voltage of the driver circuit, in addition to a second voltage source that provides a control voltage which is used to adapt the driver circuit to different load magnitudes.

9 Claims, 6 Drawing Sheets

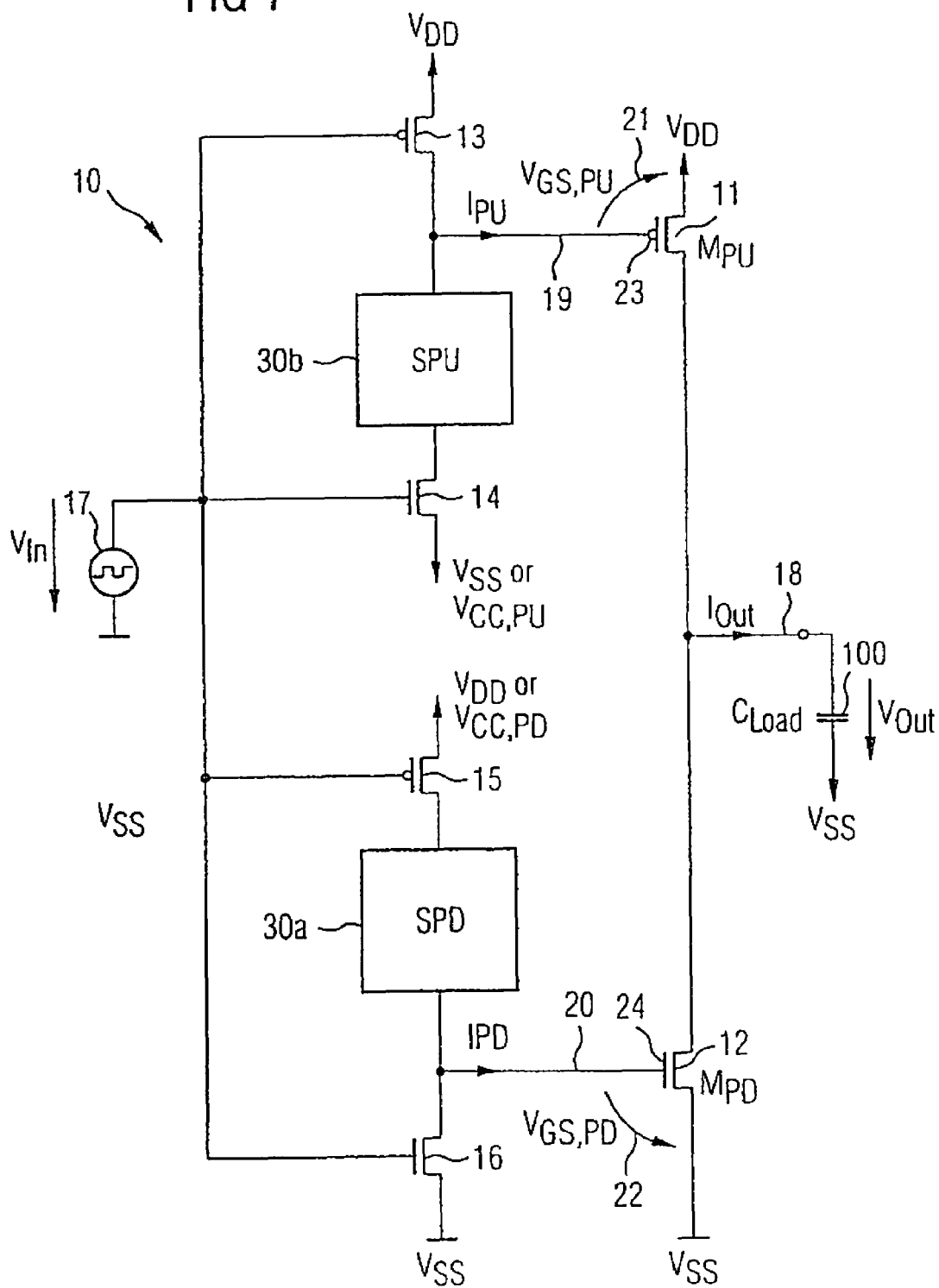

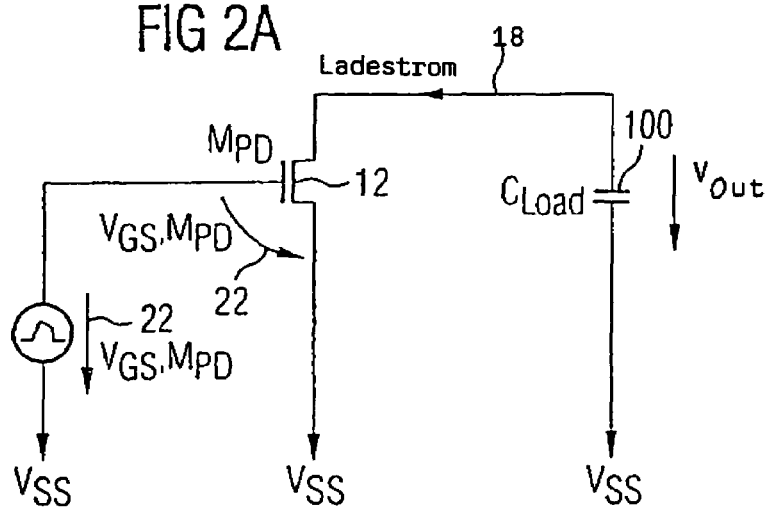
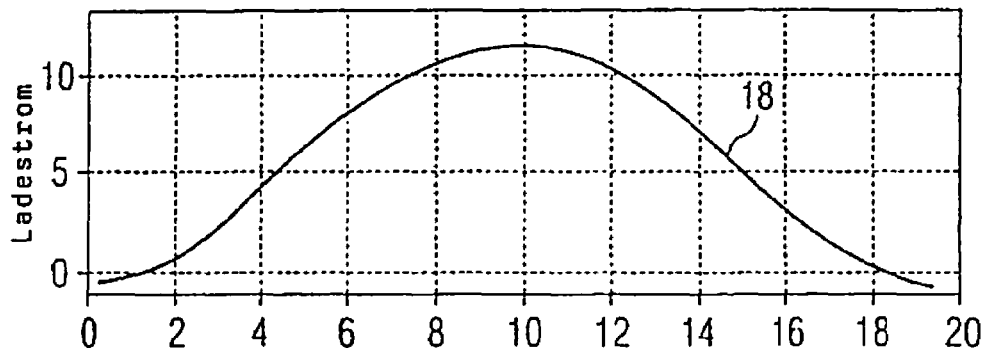
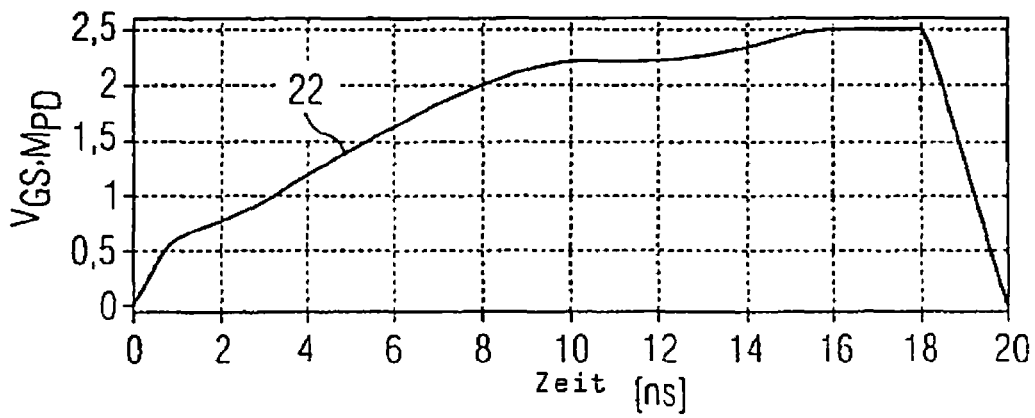

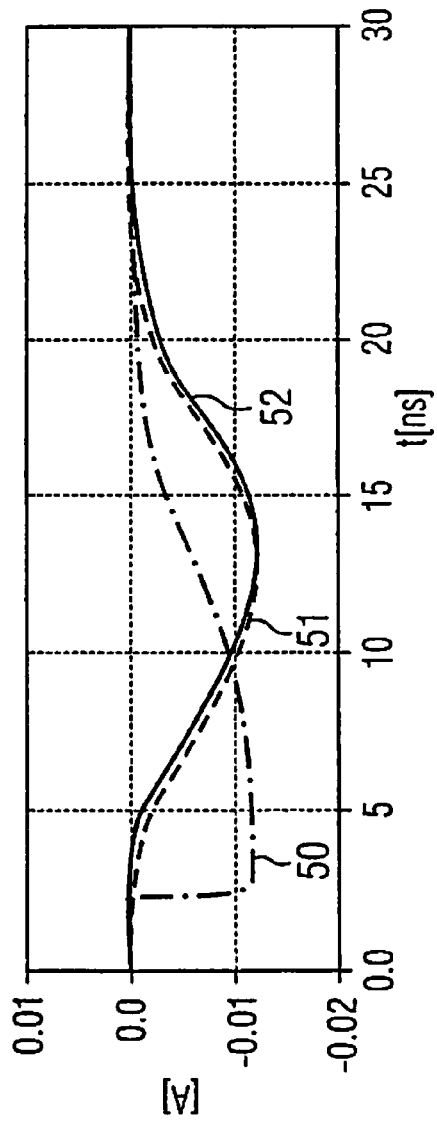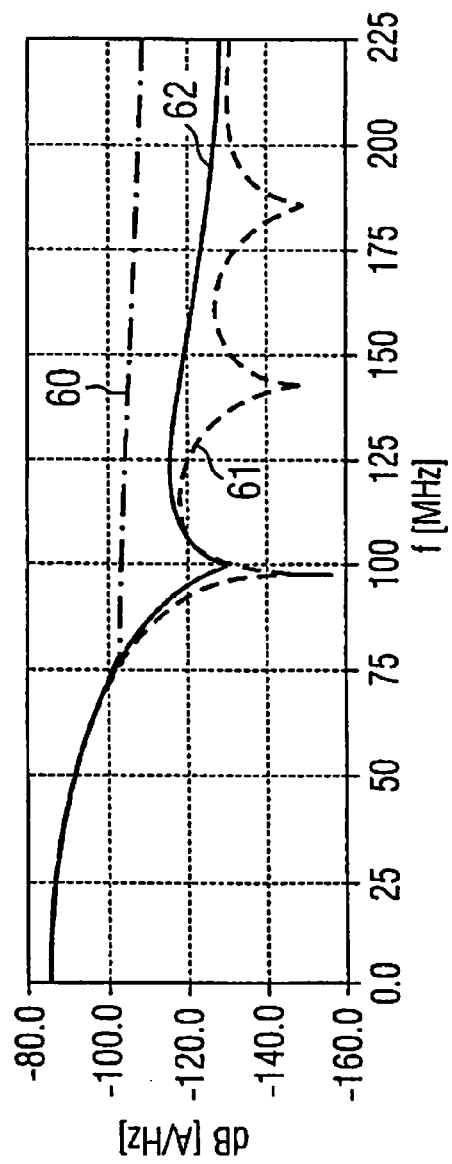

DRIVE CIRCUIT

The present invention relates to a driver circuit and to the advantageous use of such a driver circuit.

Drivers and driver circuits are known for example as pad drivers of integrated circuits such as microcontrollers, microprocessors, ASICs, memory modules or the like and to a large extent determine the electromagnetic behavior (EMC) of digital assemblies, such as, for example, control units in automotive or automation technology.

What are crucial for such drivers and driver circuits are the relatively large current transients (dI/dt) which are necessary in order to charge, or to discharge, the usually capacitive loads, connected to the drivers, to a specific voltage potential in a relatively short time. These times, which are called rise times (trise) and fall times (tfall), represent the rising and falling edge, respectively, and are specified in the specification of the driver for a specific maximum load magnitude. The rise time may be, for example, that period of time required by a voltage signal in order to pass from 10% to 90% of the value of the specific voltage potential. The opposite applies analogously to the fall time.

The driver strength is usually designed in such a way that the driver complies with the guaranteed driver and timing properties under the least expedient permissible conditions (worst case).

An ideal driver in respect of the electromagnetic behavior has maximally allowed long edge times independently of the prevailing external conditions, such as, for example, the ambient temperature, the operating voltage, the individual production parameters, the connected load magnitude or the like. During the switching edges, the drivers supply a charging or discharging current by means of which a load connected to the driver circuit is charged or discharged, respectively.

There is a need to be able to set the edge times of drivers in such a way that a charging or discharging current that is optimum for the respective load can be supplied by the driver circuit.

U.S. Pat. No. 4,827,159 discloses, in a different context, a circuit which can be used to influence the gate voltage of power transistors by suitable connection of series resistors.

U.S. Pat. No. 4,827,159 and U.S. Pat. No. 5,118,971 each disclose a driver circuit in which the charging current is limited by means of a resistor in each circuit block, i.e. clearly an RC element is formed together with the capacitance of the driver transistor in order to reduce harmonics of the driver transistor output signal during the driving thereof.

Furthermore, DE 195 27 736 C1 describes a driver circuit with resistors and also a regulating circuit which is used to regulate the charging current for the gate capacitance of the driver transistor. Such a regulating arrangement is very slow, for which reason the driver circuit from DE 195 27 736 C1 is unsuitable for frequencies in a range of 10-100 MHz, for example.

U.S. Pat. No. 5,214,320 discloses a driver circuit in which the driver transistor is always charged to the operating voltage. This is due to the fact that the operating potential is present at the drain terminal of the respective transistor (in accordance with U.S. Pat. No. 5,214,320 Q14, Q17), and the variable control voltage (in accordance with U.S. Pat. No. 5,214,320 V1, V2) at the two transistors only influences the speed at which the driver transistors (in accordance with U.S. Pat. No. 5,214,320 Q11, Q12) are charged to the operating potential.

An object of the present invention is to provide an improved driver circuit in respect of flexible load adaptation, which driver circuit can be used to generate, in particular, a load-independent output current profile that improves the electromagnetic compatibility for different switching times.

This object is achieved according to the invention by means of a driver circuit for generating an output current for charging or discharging a load connected to the driver circuit, which output current has the least harmonics possible and is, in particular, $\sin^2$-shaped, said driver circuit having one or more driver transistor(s) which is/are connected or connectable to the load. Furthermore, at least one circuit block is provided, which is designed for the control, in particular for the variable control, of the voltage at the gate node/gate nodes of the driver transistor/driver transistors, and which is connected to the latter. The circuit block has a current source which controls the voltage at the gate node/gate nodes of the driver transistor/driver transistors. Furthermore, the circuit block has a first voltage source, which provides the operating voltage of the driver circuit, and also a second voltage source, which provides a control voltage which enables the driver circuit to be adapted to different load magnitudes.

In this connection, a current source is to be understood as an element which provides a constant current, i.e. a current-supplying component with an internal resistance of ideally infinite magnitude. By means of the current source, in particular, according to the invention, a constant current is impressed into the gate capacitance of the driver transistor.

By means of the second voltage source, the respective driver transistor is not charged to the operating voltage, but rather to the control voltage, which can be set in variable fashion.

This makes it possible to be able to enter into different load situations in a highly flexible manner, in particular into those load situations in which it is necessary to drive a load not with the full operating voltage.

A driver circuit according to the invention that is designed in this way has a series of advantages.

Firstly, it is possible to achieve a great improvement in the electromagnetic compatibility by virtue of the fact that, during the switching edges, the driver circuit supplies for a load connected to the driver circuit a charging/discharging current which has the least harmonics possible, that is to say has a "soft", "flat" profile. In this case, it has been found that, in particular, impressing a $\sin^2$-shaped current into the advantageously capacitive output load results in a favorable interference spectrum from an EMC standpoint. This signal waveform can be approximated by the driver circuit according to the invention. Furthermore, the driver circuit according to the invention affords the possibility of adapting the driver power to a respective load magnitude in a simple manner, whilst retaining the property mentioned above. Lastly, it is also possible to realize different switching times by slight modification of the driver circuit. This is explained in more detail in the further course of the description.

A further basic concept of the present invention is that the at least one driver transistor is connected to a circuit block via which the voltage at the gate node of the driver transistor can be controlled. Via this circuit block, it becomes possible for the driver transistor not to be switched in "hard" fashion, but rather to be switched in suitably "soft" fashion, which brings about a favorable interference spectrum. The circuit block according to the invention provides the gate node of the driver transistor with a specific voltage profile which enables the advantageous charging/discharging current as described above. If the charging/discharging current is intended to have an approximately $\sin^2$-shaped profile, as is illustrated for example in FIG. 2b, a voltage with the profile illustrated in FIG. 2c must be generated via the voltage block.

As will be explained in more detail in the further course of the description, the circuit block furthermore makes it possible to adapt the driver behavior (driver power) to an external load respectively connected to the driver circuit. Usually, the rise times and fall times of a driver circuit—and thus also the temporal current profile—depend on the magnitude of the attached load or the load capacitance. In the case of small loads, in particular, a large interference potential is present since an unregulated driver would subject them to charge reversal too rapidly. Equally, as will be described in more detail further below, it is possible with the driver circuit according to the invention to set different edge times by adaptation of the at least one circuit block.

The invention is not restricted to specific configurations of the circuit block. By way of example, the circuit block can perform the function of a current source or of a current sink for driving the at least one driver transistor. A non-exclusive exemplary configuration for an advantageous circuit block is presented in the further course of the description.

The driver circuit according to the invention may, for example, have a basic structure with which a capacitive output load Cload is charged to an upper operating voltage Vdd (Vin=Vdd) or discharged to a lower operating voltage Vss (Vin=Vss), by means of a current Iout. By means of advantageous circuitry embodiments of the at least one circuit block, by impressing a current, the gate-source voltage (VGS) of the at least one driver transistor can be controlled in such a way that the charging/discharging current is approximately $\sin^2$-shaped.

Advantageous embodiments of the driver circuit according to the invention emerge from the subclaims.

Preferably, two driver transistors may be provided. One of the driver transistors may preferably be designed as a so-called pull-up transistor, which represents a driver for the positive edge. The other driver transistor may preferably be designed as a pull-down transistor, which is a driver for the negative edge.

Advantageously, two driver transistors and two circuit blocks may be provided, a respective circuit block being connected to in each case one of the driver transistors.

In a further refinement, the at least one circuit block may have one or more transistors. By way of example, three transistors may in each case be provided per circuit block. However, the invention is not fixed at this specific number of transistors.

Rather, the respectively suitable number of transistors emerges as required and depending on the application.

Preferably, the at least one circuit block may have a voltage source for a constant voltage (Vbias).

The transistors of the circuit block form a current source, for example, with the constant voltage Vbias, which current source charges the gate of the driver transistor, connected to the circuit block, in a controlled manner from the lower operating voltage Vss to an upper operating voltage Vdd. In this case, the circuit block may be embodied as a source follower, for example.

If the circuit block is designed as a current source, for example, such an embodiment and also the targeted utilization of the parasitic gate-drain capacitances of the actual driver transistor enable the load current profile to be shaped within wide limits.

The at least one circuit block may have a voltage source for a control voltage (Vcc). Such a control voltage enables simple adaptation to different load magnitudes. Through adaptation of the control voltage, or the control voltages in the case of a plurality of circuit blocks, it is possible to operate load capacitances of different magnitude whilst maintaining the given rise times or fall times. This adaptation can be effected for example "online" by means of corresponding regulation, or "offline" by means of programming or specification.

Preferably, a component of the circuit block, which component determines the timing, may have a transistor.

In a further refinement, a component of the circuit block, which component determines the timing, may have a transistor network. As a result, the circuit block can be adapted in such a way that different edge times can be set. By using a transistor network, the circuit block can be designed as a switchable current source, for example.

The component which determines the timing may be designed either as a transistor or as a transistor network. However, it is also possible for the component which determines the timing to have a combination of the abovementioned components.

The transistor network may have, for example, a series circuit and/or a parallel circuit of two or more transistors.

The invention's configuration of the driver circuit enables the latter to be adapted to the respectively prevailing operating situations in a simple yet accurate manner. An asymmetry occurring toward small load capacitances leads to deviations from the ideal profile, yet the interference spectrum is considerably better compared with a standard driver which is only designed for a single load case and would have an excessively large driver power for smaller loads. This is due inter alia to the fact that the maximum current is also reduced by the driver circuit according to the invention.

In a particularly advantageous manner, the driver circuit according to the invention may be designed as a CMOS circuit, in particular as an analog CMOS circuit.

Advantageously, the driver circuit according to the invention may be connected or connectable to a capacitive load. Such a load may be, on the one hand, the capacitance of a load, for example an electronic component, connected to the driver circuit. Furthermore, parasitic capacitances or the like which occur at the output of the driver circuit or in the connection of the driver circuit to the respective load may also be combined under the term of load capacitance. Even though the load is preferably designed as a capacitive load, the invention is not restricted to such an embodiment. In principle, the use of the present invention would also be conceivable in connection with resistive loads, inductive loads or the like.

In a particularly advantageous manner, the driver circuit according to the invention may be used as a driver, in particular as a pad driver, for integrated circuits.

The invention will now be explained in more detail using exemplary embodiments with reference to the accompanying drawing.

In the figures,

FIG. 1 shows a schematic circuit arrangement of the driver circuit according to the invention;

FIG. 2a shows an equivalent circuit diagram illustrating the gate-source voltage with which a driver transistor is to be driven in order to obtain an approximately $\sin^2$-shaped current during the discharging of the load capacitance;

FIG. 2b shows a diagram illustrating said $\sin^2$-shaped current profile against time;

FIG. 2c shows a diagram illustrating the voltage profile against time with which a current profile illustrated in FIG. 2b can be made possible;

FIGS. 6a and 6b show curve diagrams with regard to the discharging of a 50 pF load capacitance, the respective current profile with its spectrum being illustrated for different driver types.

Figure 3:
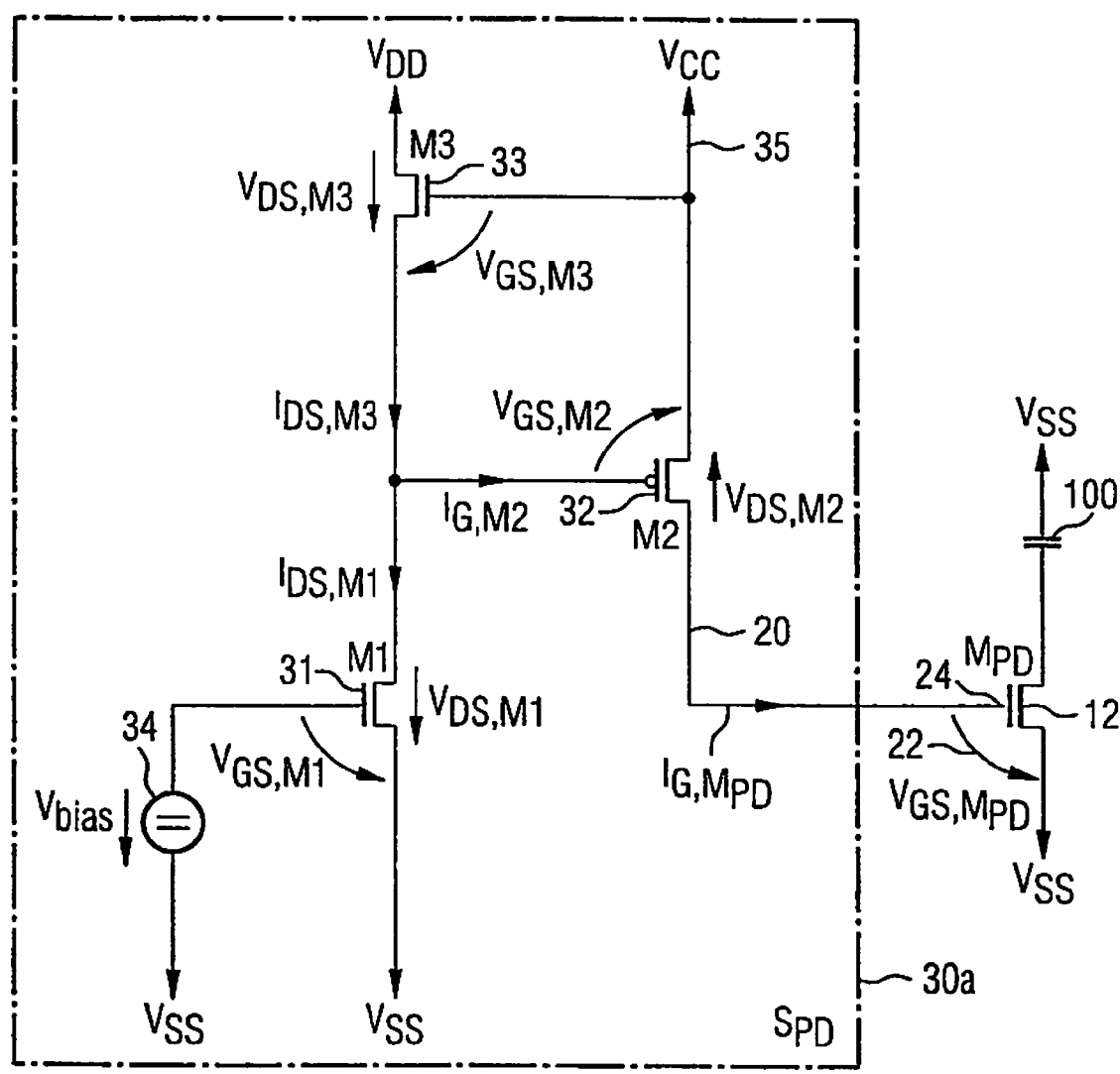
FIG. 3 shows a circuit diagram of a circuit block illustrated in FIG. 1.

FIG. 1 illustrates the basic structure of a driver circuit 10 designed as a pad driver, which is connected to a load 100 designed as a load capacitance (Cload). By means of the driver circuit, the capacitive output load (Cload) 100 is charged or discharged to an output voltage (Vout) corresponding to the upper operating voltage (Vdd) or the lower operating voltage (Vss), respectively, by means of a current (Iout). To that end, the driver circuit 10 has a voltage source 17 for an input voltage, and also two circuit paths in which in each case a driver transistor 11 or a driver transistor 12 is illustrated. The driver transistor 11 is designed as a so-called pull-up transistor, while the driver transistor 12 is a so-called pull-down transistor. The two driver transistors 11, 12 are respectively connected to a corresponding circuit block 30a, 30b. By means of a suitable circuitry embodiment of the two circuit blocks 30a, 30b, what can be achieved by impressing corresponding currents (Ipd) 20 and (Ipu) 19 is that the gate-source voltages (VGS,pd) 22 and (VGS,pu) 21 respectively, at the gate nodes 23, 24 of the driver transistors (MPD) 12 and (MPU) 11, respectively, are controlled in such a way that the charging/discharging current (Iout) 18 is approximately $\sin^2$-shaped.

In the exemplary embodiment in accordance with FIG. 1, the circuit block 30a is designed as a current source (SPD), while the circuit block 30b functions as a current sink (SPU).

In order to complete the two circuit paths, provision is furthermore made of additional transistors 13, 14 and 15, 16, respectively, with different functions.

In the further course of the description, firstly the explicit configuration of the circuit block 30a will be explained in greater detail. However, it is pointed out that the circuit block 30b can be configured in a corresponding manner.

FIG. 2a illustrates the gate-source voltage (VGS,MPD) 22 with which the driver transistor (MPD) 12 designed as a pull-down transistor is to be driven in order to obtain a $\sin^2$-shaped current 18 during the discharging of the load capacitance (Cload) 100.

FIG. 2b illustrates said $\sin^2$-shaped profile of the current 18 against time. In order to obtain such a current profile, a voltage profile of the gate-source voltage (VGS) 22 as is illustrated in FIG. 2c is required.

Said voltage profile is generated to a good approximation by the configuration of the circuit block 30a that is illustrated in FIG. 3.

The circuit block 30a has a total of 3 transistors (M1, M2, M3) 31, 32, 33, which form a current source (SPD) 30a with a voltage source 34 for a constant voltage (Vbias), which current source charges the gate 24 of the pull-down transistor (MPD) 12 in a controlled manner from the lower operating voltage (Vss) to the upper operating voltage (Vcc).

The control voltage (Vcc) made available by means of a voltage source 35 serves in this case for adaptation to different load capacitance magnitudes 100. The voltage block (SPD) 30a is embodied as a so-called source follower in the present exemplary embodiment. As revealed by FIG. 3, given identical geometries of the transistors 31 and 33, to a first approximation, VGS,M2=−Vbias always holds true, to be precise independently of the control voltage Vcc.

Figure 4:
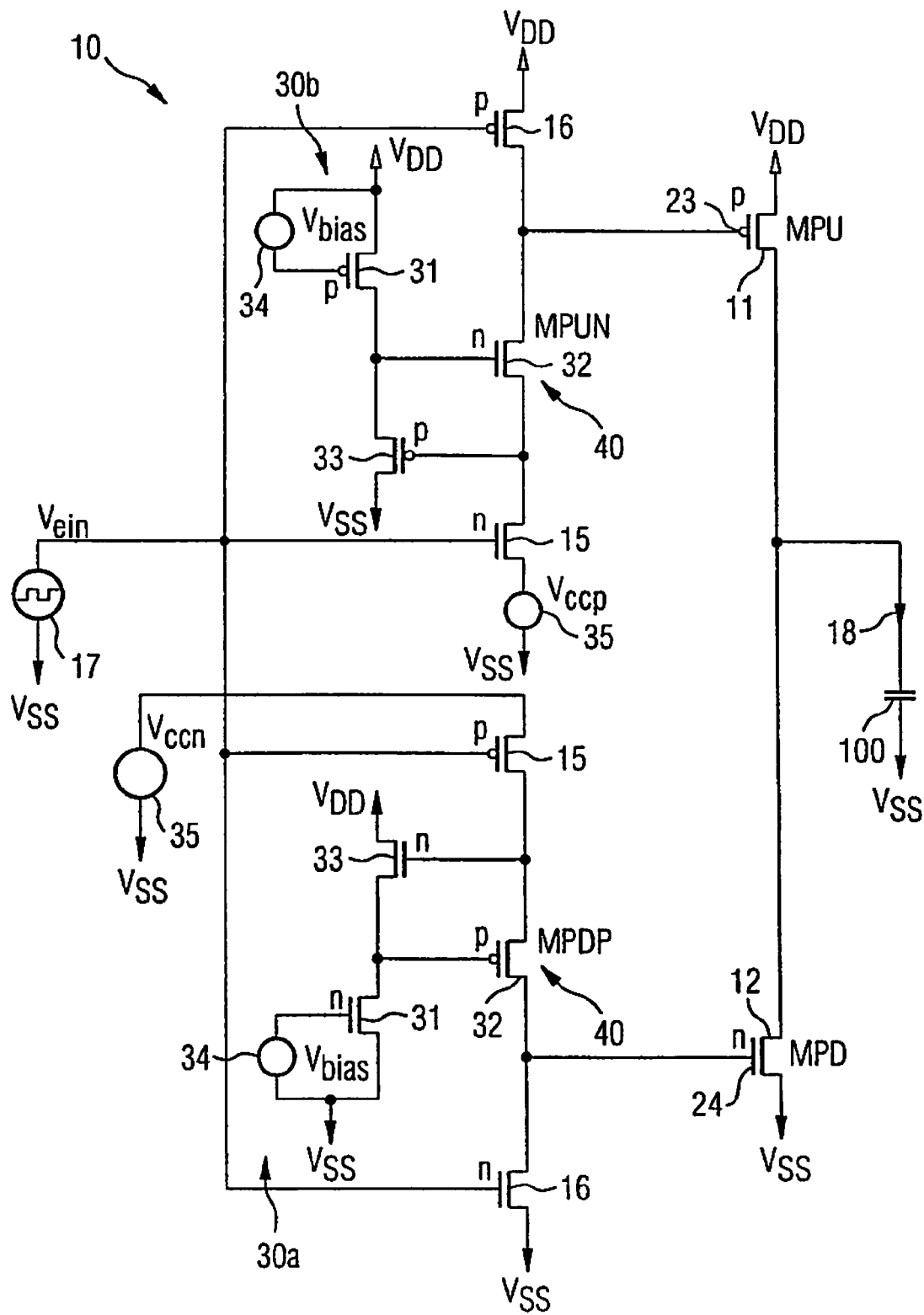
FIG. 4 shows a circuit arrangement which is supplemented with regard to FIG. 1 and in which the individual circuit blocks are explicitly illustrated.

FIG. 4 shows a complete driver circuit 10, having a pull-up and a pull-down path. The pull-up path has the circuit block (SPU) 30b and also the driver transistor (MPU) 11, while the pull-down path has the circuit block (SPD) 30a and also the driver transistor (MPD) 12. The good approximation of the discharging current profile 18 to the $\sin^2$ shape is reflected in a good interference spectrum. A standard driver having the same fall time as the driver circuit 10 according to the invention would have a significantly poorer spectrum, caused by a very rapid rise in the discharging current 18.

One example of this is illustrated in FIGS. 6a and 6b. These figures show curve diagrams with regard to the discharging of a 50 pF load capacitance, the respective current profile with its spectrum being illustrated for different driver types.

FIG. 6a illustrates the current profile as is present during the discharging of the 50 pF load capacitance. The dash-dotted curve 50 corresponds to the current profile of a standard driver known from the prior art. As can be seen, the current falls sharply after a short time, which is disadvantageous. The current profile of an idealized driver is illustrated by the dashed curve 51. As can be seen from the solid curve 52 for the driver circuit according to the invention, the discharging current profile of said driver circuit is very well matched to the idealized current profile 51.

FIG. 6b illustrates the signal profile in accordance with FIG. 6a after having been transformed into the frequency domain. The frequency is plotted on the X axis and the amplitude spectrum in logarithmic representation is plotted on the Y axis. The dash-dotted curve 60 for the known standard driver shows that the amplitude spectrum is relatively large for the frequency range considered. It is desirable, however, for the amplitude spectrum to fall as sharply as possible toward higher frequencies. The ideal frequency profile is illustrated by the dashed curve 61 for the idealized driver circuit. As can be seen from the curve profile 62 for the driver circuit according to the invention, said driver circuit achieves the idealized curve profile at least to a greatly approximated extent.

By adapting the control voltage (Vccp) of the circuit block 30b to the control voltage (Vccn) of the circuit block 30a, it is possible to operate load capacitances 100 of different magnitude whilst retaining predetermined rise times/fall times. The control voltages can be adapted either "online" by corresponding regulation or, alternatively, "offline" by means of corresponding programming or specifications. In the exemplary embodiment in accordance with FIG. 4, the components (40) which determine the timing of the driver circuit 10 are the transistors (MPUN, MPDP) 32 of the respective circuit blocks 30a, 30b. If these are now replaced by a transistor network or supplemented by such a network, the driver circuit 10 can be set digitally to different rise times/fall times.

Figure 5:
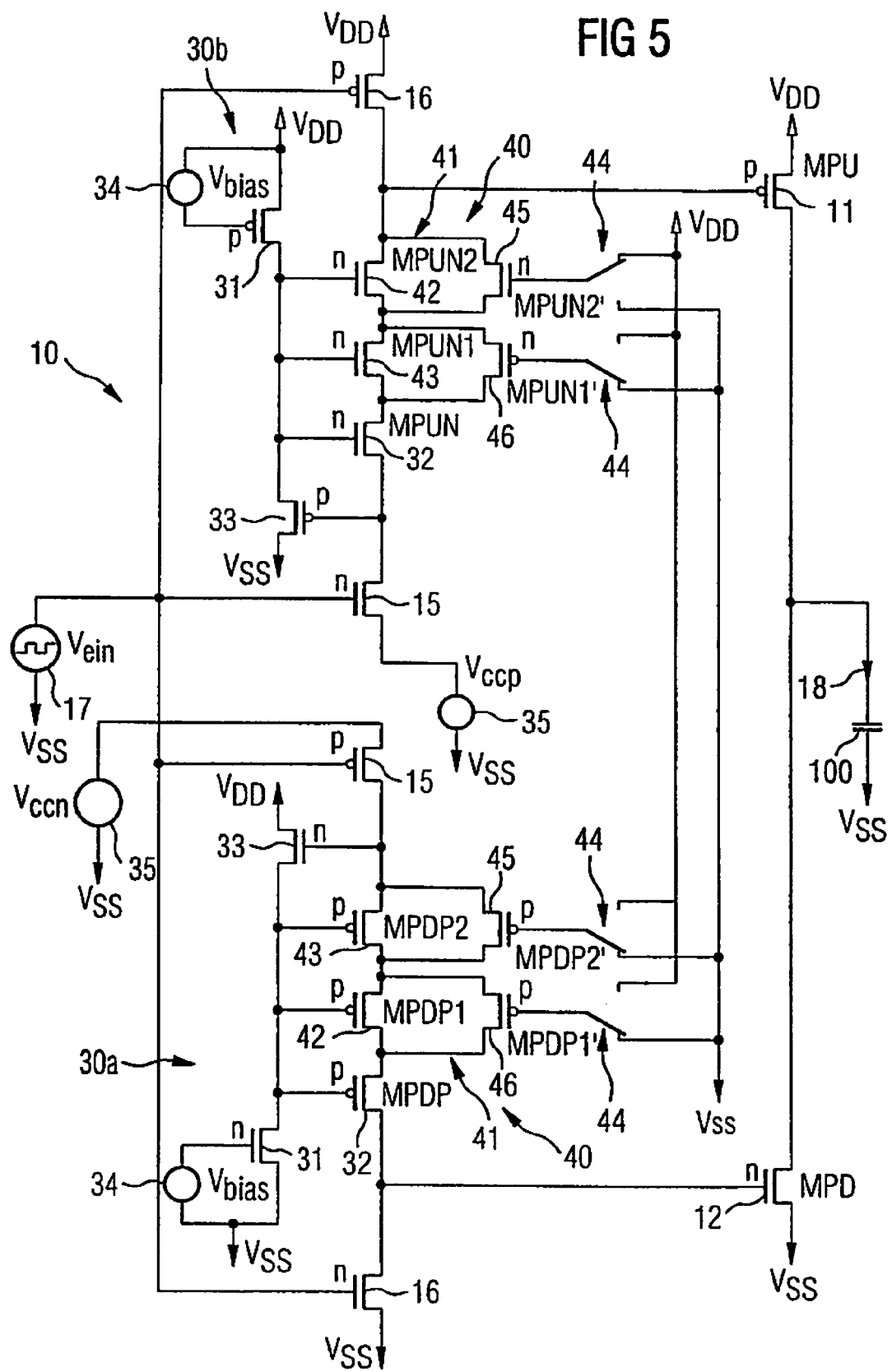
FIG. 5 shows a driver circuit in accordance with a further embodiment of the present invention, which driver circuit is modified with regard to FIG. 4.

Such an embodiment of the driver circuit according to the invention is illustrated in FIG. 5. The basic construction of the driver circuit 10 in accordance with FIG. 5 corresponds to that of the driver circuit 10 as is illustrated in FIG. 4, so that identical components are provided with identical reference numerals. Furthermore, in order to avoid repetition, renewed description of the basic construction of the driver circuit 10 is dispensed with and, instead of this, reference is made to the explanations concerning FIG. 4.

In contrast to the embodiment illustrated in FIG. 4, the driver circuit 10 in accordance with FIG. 5 has, as a component 40 of the circuit blocks 30a, 30b, which component determines the timing, in addition to the transistors (MPUN, MPDP) 32, a transistor network 41 formed from a series circuit of suitably dimensioned transistors 42, 43. The number of transistors used for the transistor network 41 emerges as required and depending on the application. By means of such a transistor network 41, the driver circuit 10, or the driver transistor 11 or 12, can be set to different rise times/fall times. In the case of the exemplary embodiment illustrated in FIG. 5, by means of corresponding switch elements 44, it is possible to select from in each case four different rise times and fall times by virtue of the fact that the voltage profile at the gate of the driver transistor can be influenced by means of bypass transistors (MPUN1', MPUN2', MPDP1', MPDP2') 45, 46.

The driver circuits described make it possible, in a simple yet accurate manner, to generate a load-independent, EMC-favorable output current profile for different switching times.

LIST OF REFERENCE SYMBOLS

10 Driver circuit
11 Driver transistor (pull-up)
12 Driver transistor (pull-down)
13 Transistor
14 Transistor
15 Transistor
16 Transistor
17 Voltage source (input voltage)
18 Output current
19 Impressed current (driver transistor 11)
20 Impressed current (driver transistor 12)
21 Gate-source voltage (driver transistor 11)
22 Gate-source voltage (driver transistor 12)
23 Gate node (driver transistor 11)
24 Gate node (driver transistor 12)
30a Circuit block
30b Circuit block
31 Transistor
32 Transistor
33 Transistor
34 Voltage source (constant voltage Vbias)
35 Voltage source (control voltage Vcc)
40 Component which determines the timing
41 Transistor network
42 Transistor
43 Transistor
44 Switch element
45 Bypass transistor
46 Bypass transistor
50 Current profile of a standard driver circuit
51 Current profile of an idealized driver circuit
52 Current profile of a driver circuit according to the invention
60 Frequency profile of a standard driver circuit
61 Frequency profile of an idealized driver circuit
62 Frequency profile of a driver circuit according to the invention
100 Load

The invention claimed is:

1. A driver circuit for generating an output current for charging or discharging a load connected to the driver circuit, which output current has the least harmonics possible and is, in particular, $\sin^2$-shaped, said driver circuit being operable at an operating voltage and comprising:

at least one driver transistor, which is connected to the load, said driver transistor further including at least one gate node;

and at least one circuit block, which is designed for the control, in particular for the variable control, of the voltage at the gate node of the driver transistor, said circuit block being connected to said gate node, the circuit block having a transistor, whose drain terminal is coupled to the gate node of the driver transistor, the voltage between the gate terminal of the transistor and the source terminal of the transistor being kept essentially constant, the circuit block having a first voltage source, which provides the operating voltage of the driver circuit, the circuit block having a second voltage source, which is coupled to the source terminal of the transistor and which provides a load control voltage which enables the driver circuit to be adapted to different load magnitudes independently of the operating voltage provided by the first voltage source, the circuit block having a third voltage source, which defines the voltage between the gate terminal and the source terminal of the transistor, whose drain terminal is coupled to the gate node of the driver transistor.

2. The driver circuit as claimed in claim 1, in which two driver transistors are provided, and in which, in particular, one of the driver transistors is designed as a pull-up transistor and one of the driver transistors is designed as a pull-down transistor.

3. The driver circuit as claimed in claim 1, in which two driver transistors and two circuit blocks are provided, and in which a respective circuit block is connected to in each case one of the driver transistors.

4. The driver circuit as claimed in claim 1, further including a component in the circuit block, said component determining the timing of the rise time of the output current for charging the load and of the fall time of the output current for discharging the load, said component further having a transistor.

5. The driver circuit as claimed in claim 1, further including a component in the circuit block, said component determining the timing of the rise time of the output current for charging the load and of the fall time of the output current for discharging the load, said component further having a transistor network.

6. The driver circuit as claimed in claim 5, in which the transistor network has a series circuit and/or parallel circuit of at least two transistors.

7. The driver circuit as claimed in claim 1, said circuit being designed as a CMOS circuit, in particular as an analog CMOS circuit.

8. The driver circuit as claimed in claim 1, in which said driver circuit is connected or connectable to a capacitive load.

9. The use of a driver circuit as claimed in claim 1 as a driver, in particular as a pad driver, for integrated circuits.

* * * * *

UNITED STATES PATENT AND TRADEMARK OFFICE
CERTIFICATE OF CORRECTION

PATENT NO. : 7,474,131 B1  Page 1 of 1
APPLICATION NO. : 10/181902
DATED : January 6, 2009
INVENTOR(S) : Marie-Claire Hoffman, Christian Paulus and Ralf Klein It is certified that error appears in the above-identified patent and that said Letters Patent is hereby corrected as shown below:

Title page, item (22), to read as follows:

--PCT Filed: Jan. 22, 2001--

Signed and Sealed this

Twenty-third Day of June, 2009

JOHN DOLL
*Acting Director of the United States Patent and Trademark Office*